United States Patent [19]

Main

[11] Patent Number: 4,926,132
[45] Date of Patent: May 15, 1990

[54] FM DETECTOR WITH REDUCED DISTORTION

[75] Inventor: William E. Main, Mesa, Ariz.

[73] Assignee: Motorola Inc., Schaumburg, Ill.

[21] Appl. No.: 399,792

[22] Filed: Aug. 28, 1989

[51] Int. Cl.$^5$ .............................................. H03D 3/14
[52] U.S. Cl. .................................... 329/318; 329/336; 329/337; 455/214; 455/312
[58] Field of Search ............... 329/318, 320, 336, 337, 329/319; 455/214, 312

[56] References Cited

U.S. PATENT DOCUMENTS 4,375,618  3/1983  Jett, Jr. .................................. 329/319
4,656,432  4/1987  Matsummura .................. 329/336 X Primary Examiner—Siegfried H. Grimm
Attorney, Agent, or Firm—Michael D. Bingham

[57] ABSTRACT

An FM detection circuit utilizes a first multiplier and phase shift circuit to demodulate an FM signal. The output signal also contains harmonic distortion as a result of the demodulation process. A gain control circuit is included to provide a first gain control signal to the first multiplier which adjusts the magnitude of the output signal of the FM detection circuit in such a manner as to substantially eliminate the harmonic distortion. The gain control circuit uses a second multiplier to generate an output signal proportional to the square of the output signal of the phase shift circuit which is then compared to a constant current to produce an error signal proportional to the harmonic distortion. The error signal controls the magnitude of the first gain control signal such that the output signal of the FM detection circuit is proportional to the deviation of the FM signal from its center frequency.

14 Claims, 3 Drawing Sheets 4,926,132

FM DETECTOR WITH REDUCED DISTORTION

BACKGROUND OF THE INVENTION

The present invention relates in general to demodulators and, more particularly, to an FM (frequency modulation) detector circuit with means to substantially eliminate the harmonic distortion in the demodulated output signal.

FM demodulators are used in many consumer electronics, i.e., stereos and cellular telephones, to recover the information encoded in an FM transmission. One FM demodulator, as disclosed in U.S. Pat. No. 4,375,618 issued Mar. 1, 1983 to Jett, Jr., includes a gain controllable multiplier and a quadrature phase shift network which are responsive to an applied FM signal. The phase shift network is typically tuned to provide $\pi/2$ radians of phase lag to the FM signal at the center (carrier) frequency. The phase shifted FM signal is also applied to the multiplier for providing an output signal the amplitude of which is proportional to the deviation of the frequency of the FM signal from the tuned quadrature frequency of the phase shift network. Thus, the FM input signal has been converted to a more directly useful amplitude modulated (AM) signal capable of driving output devices such as speakers and headsets.

One problem associated with the aforedescribed FM demodulator is that the output signal contains odd harmonic distortion attributed to the nonlinear frequency behavior of the passive components of the phase shift network. In addition, second harmonic distortion is introduced by drift in the tuned quadrature frequency and delays within the multiplier. The harmonic distortion may attenuate the output signal leading to possible misinterpretation of the FM signal. To solve the distortion problem, the '618 patent uses a complex feedback circuit comprising an audio stage and a fullwave rectifier which are coupled between the output of the multiplier and the control input of a current source. The output of the current source is coupled to the multiplier for providing a gain control signal to adjust its linear range. The audio stage extracts the second harmonic from the output signal and combines it with the fundamental in the fullwave rectifier to generate a third harmonic which modulates the gain control signal and removes the third harmonic component of the output signal. The circuit works fine to remove that portion of the distortion attributed to the third harmonic; however, it may have limited effectiveness with higher order harmonics and may not compensate for second harmonic distortion.

Another method to remove the harmonic distortion is to use a double-tuned circuit comprising a first tuned coil with mutual coupling to a second tuned coil. Each tuned coil will have a different center frequency which increases the linear bandwidth of the phase shift network. The double tuned circuit has proven to be difficult to tune in production and sensitive to component variation and drift.

Hence, there is a need for a simple FM detector circuit having means to substantially eliminate the distortion attributed to the total harmonic spectrum of the output signal such that the amplitude thereof is truly proportional to the deviation of the instantaneous frequency of the FM signal from the center frequency.

SUMMARY OF THE INVENTION

It is therefor an objective of the present invention to provide an improved FM detector circuit.

Another objective of the present invention is to provide an improved FM detector circuit with means to generate an error signal which is proportional to the nonlinear behavior of the FM detector circuit.

A further objective is to provide an improved FM detector circuit which uses the error signal to control the gain of the demodulating multiplier to compensate for the harmonic distortion in the output signal.

In accordance with the above and other objectives there is provided an improved FM detection circuit including a phase shift circuit and first and second multipliers. The first multiplier is responsive to an applied FM signal and a phase shifted FM signal for providing a demodulated output signal. The output signal also contains harmonic distortion as a result of the demodulation process. The second multiplier receives the phase shifted FM signal and provides an output signal proportional to the square thereof. A constant current is compared to the output signal of the second multiplier to generate an error signal. A current supply means receives the error signal and provides first and second substantially equal gain control signals which are proportional to the harmonic distortion. The second multiplier circuit is responsive to the second gain control signal for adjusting the magnitude of the output signal of the second multiplier to a value equal to the constant current. The first multiplier is responsive to the first gain control signal for providing an output signal which is proportional to the deviation of the frequency of the FM signal from the center frequency, thus substantially eliminating the harmonic distortion.

DETAILED DESCRIPTION OF THE PREFERRED EMBODIMENT

Figure 1:
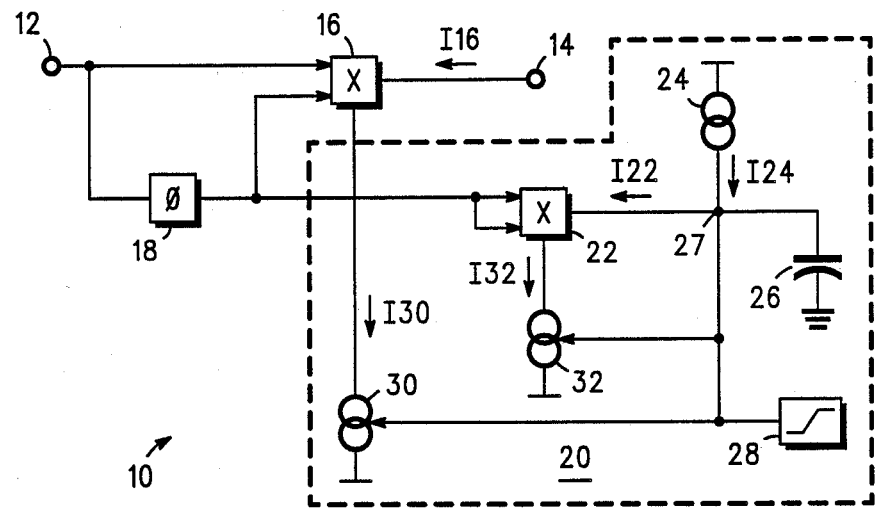
FIG. 1 is a simplified schematic and block diagram illustrating the preferred embodiment of the present invention.

With reference to FIG. 1, FM detector circuit 10 may be realized as a monolithic integrated circuit using conventional integrated circuit processes. FM detector circuit 10 has input 12 and output 14 which are coupled to the first port of gain controllable multiplier 16 and the output of multiplier 16 respectively. Phase shift circuit 18 has an input and an output which are coupled to input 12 and the second multiplier port of multiplier 16 respectively. Gain control circuit 20 includes gain controllable multiplier 22 having first and second ports which are coupled together to the output of phase shift circuit 18 such that the output signal of multiplier 22 is proportional to the square of the phase shifted FM signal. The first terminal of capacitor 26 is coupled at node 27 to the output of multiplier 22. A voltage, typically ground potential, is applied to the second terminal of capacitor 26. Current supply 24 receives a power supply voltage, typically $V_{CC}$, for providing current $I_{24}$ flowing into node 27. Limiter circuit 28 and the control inputs of current supplies 30 and 32 are also coupled to node 27. Current supplies 30 and 32 provide substantially equal currents $I_{30}$ and $I_{32}$ to multipliers 16 and 22 respectively.

The operation of FM detector circuit 10 is now discussed in detail assuming the initial condition that the control inputs of current supplies 30 and 32 are momentarily disconnected from node 27, thus disabling gain control circuit 20 causing the remainder of the circuit to behave as a conventional demodulator. Currents $I_{30}$ and $I_{32}$ are then assumed to be constant. The FM signal, applied to input 12, operates over a range of frequencies about a carrier or center frequency ($f_c$). Phase shift circuit 18 is responsive to the FM signal for providing a phase shifted FM signal having an amplitude, $A(\omega)$, and phase, $\pi/2 \pm \phi(\omega)$, relative to the FM signal where $\phi(\omega)$ is the deviation of the relative phase as a function of the radian frequency, $\omega$. Typically, phase shift circuit 18 is tuned such that the phase is $\pi/2$ radians at frequency $f_c$. Current $I_{16}$ flowing in the output of multiplier 16 is proportional to the product of the FM signal and the phase shifted FM signal. The proportionality, or gain, is controlled by current $I_{30}$. Thus, the ratio of currents $I_{16}$ to $I_{30}$ is the transfer function of multiplier 16. Initially assume that the FM signal is operating at frequency $f_c$ such that the relative phase is $\pi/2$ radians and the relative phase deviation is zero. The transfer function of multiplier 16 can than be mathematically described as the product of sine and cosine of a given angle, $\omega t$, as follows:

$$I_{16}/I_{30} = [\sin(\omega t)] * [KA(\omega) \sin(\omega t + \pi/2)] \quad (1)$$
$$= KA(\omega) * \sin(\omega t) * \cos(\omega t)$$
$$= KA(\omega)/2 * \sin(2\omega t)$$

where:
K is a constant
$\omega t$ is a particular angle in time

Hence, the transfer function of multiplier 16 is proportional to one half the amplitude and twice the frequency of the input signals. Assume now that the instantaneous frequency of the FM signal has deviated from the center frequency such that the relative phase deviation, $\phi(\omega)$, is a particular nonzero value. The transfer function of multiplier 16 can then be expressed as:

$$I_{16}/I_{30} = [\sin(\omega t)] * [KA(\omega)\sin(\omega t + \pi/2 + \phi(\omega))] \quad (2)$$
$$= KA(\omega)\sin(\omega t) * [\sin(\omega t) * \cos(\pi/2 + \phi(\omega)) + \cos(\omega t) * \sin(\pi/2 + \phi(\omega))]$$
$$= KA(\omega)/2 \, [\cos(\pi/2 + \phi(\omega)) - \cos(2\omega t) * \cos(\pi/2 + \phi(\omega)) + \sin(2\omega t) * \sin(\pi/2 + \phi(\omega))]$$

Notice that Equation (2) contains two second harmonic terms and a DC (direct current) term expressed as "$KA(\omega)/2 * \cos(\pi/2 + \phi(\omega))$". The average value of the second harmonic terms are zero over each cycle of the FM signal, and therefore may be disregarded. The parameters $A(\omega)$ and $\phi(\omega)$ are functions of the radian frequency, and therefore, considered constant with respect to time. Suppose that the parameters $A(\omega)$ and $\phi(\omega)$ could be linear functions of $\omega$, then the DC component of the current $I_{16}$, henceforth denoted as $I_{16}'$, would be identically proportional to the deviation of the instantaneous frequency of the FM signal from the center frequency, and thus, directly related to the information content of the FM signal. In other words, a particular frequency of the FM signal greater than the center frequency (positive frequency deviation) translates to a particular positive DC value corresponding to a unique piece of demodulated data. Likewise, negative frequency deviations translate to a negative DC value corresponding to another piece of demodulated data. Equation (1) does not include a DC term which agrees with the initial assumption that the FM signal was operating at frequency $f_c$, and therefore contained no modulated data.

Figure 2:
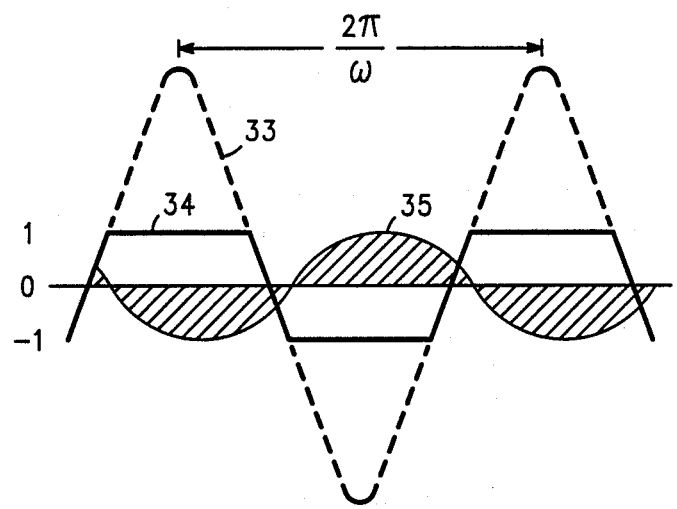
FIG. 2 is a drawing of waveforms of the FM signal and the phase shifted FM signal which are useful in the description of the invention.

Unfortunately, the parameters $A(\omega)$ and $\phi(\omega)$ are actually nonlinear functions of the radial frequency which cause the DC term in Equation (2) to be distorted (reduced in amplitude) due to the nonlinear frequency response of the passive components of phase shift circuit 18 as well as the delays within multiplier 16 and the drift in the quadrature tuning of phase shift circuit 18. To further describe this relationship, a derivation of the DC transfer function of the multiplier 16 is introduced as the ratio of currents $I_{16}'$ to $I_{30}$. The product of the FM signal and phase shifted FM signal is integrated over each half cycle of the operating frequency of the FM signal to remove the sinusoidal components leaving only the average DC value. As shown in FIG. 2, the FM signal (waveform 33) is sufficiently large that is clipped by multiplier 16 causing it to approximate a square wave (waveform 34) having a relative amplitude equal to one and a period of $2\pi/\omega$. The phase shifted FM signal is shown as waveform 35 having amplitude $A(\omega)$ and phase of $\omega t + \phi(\omega) + \pi/2$. The normalized DC transfer function of multiplier 16 is then given as:

$$I_{16'}/I_{30} = \omega/\pi \int_0^{\pi/\omega} v/2V_t * A(\omega) * \sin(\omega t + \phi(\omega) + \pi/2) \, dt \quad (3)$$
$$= -v/\pi V_t * A(\omega) * \sin\phi(\omega) \quad (4)$$

The new parameters "v" and "$V_t$" of Equation (4) are defined as the peak value and the product of "kT/q" wherein "k" is Boltzman's constant, "T" is absolute temperature and "q" is the electron charge respectively. These parameters have been extracted from previous parameter "K" in Equation (2) to provide additional detail. Parameter "a" is introduced in Equation (5) below as the frequency deviation of the FM signal normalized to the bandwidth of phase shift circuit 18. In other words, the normalized frequency deviation, "a" is equal to the ratio of the actual deviation from the center frequency to the frequency deviation at the 3 dB bandwidth. It is commonly known in the art that the deviation of the phase shifted FM signal from the center frequency $f_c$ may also be given in complex form as $1/(1+ja)$ where "j" is the complex coefficient, or equivalently, the deviation has a magnitude of $(1+a^2)^{-\frac{1}{2}}$ with an angle of $\tan^{-1}(a)$. The parameters $A(\omega)$ and $\phi(\omega)$ may now described as $A(\omega) = (1+a^2)^{-\frac{1}{2}}$ and $\phi(\omega) = \tan^{-1}(a)$. These expressions for $A(\omega)$ and $\phi(\omega)$ are substituted into Equation (4) yielding:

$$I_{16}'/I_{30} = -v/\pi V_t * (1 + a^2)^{-\frac{1}{2}} *\sin(\tan^{-1}(a)) \quad (5)$$

$$= -v/\pi V_t * (1 + a^2)^{-\frac{1}{2}} *a (1 + a^2)^{-\frac{1}{2}}$$

$$= -v/\pi V_t *a/(1 + a^2) \quad (6)$$

Figure 3:
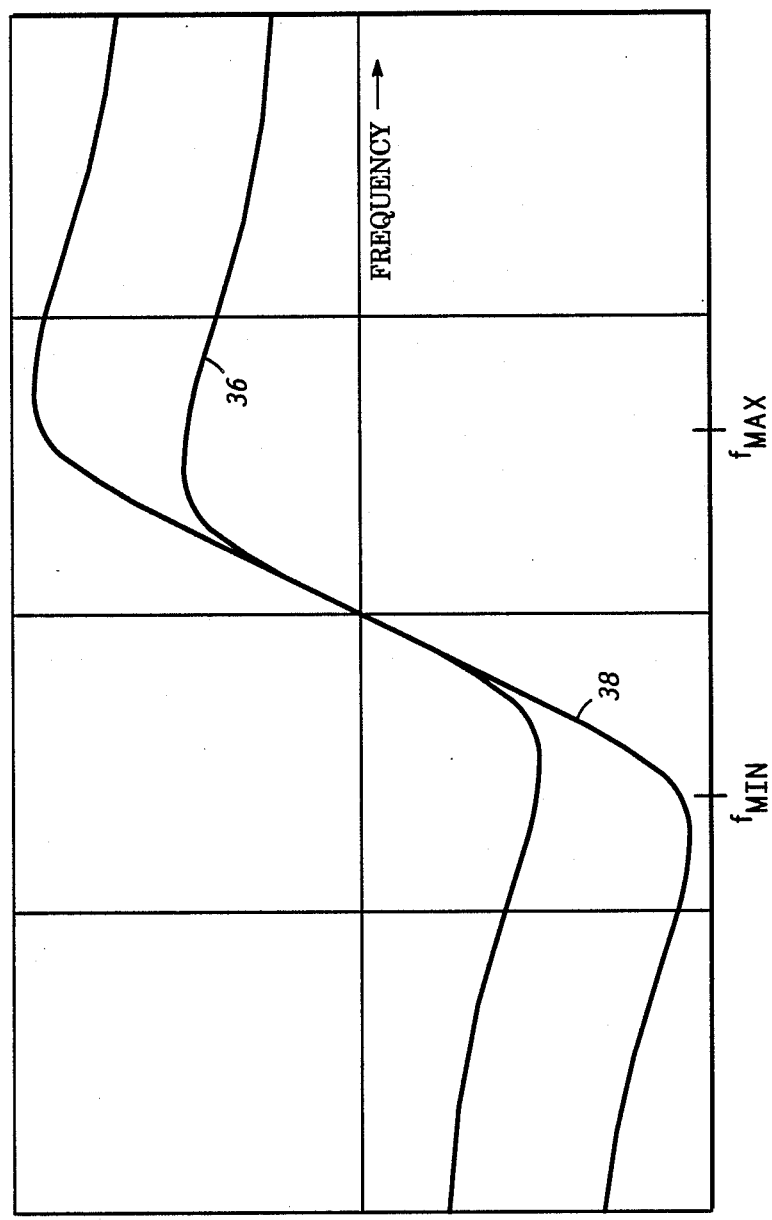
FIG. 3 is a drawing showing the transfer function of typical and linearized FM demodulators.

The nonlinearity of the normalized DC transfer function of multiplier 16 as symbolized by the "$(1+a^2)^{-1}$" term in Equation (6) can be seen in the phase versus frequency relationship, commonly known as the S-curve, of a conventional FM demodulator illustrated in waveform 36 of FIG. 3. Waveform 36 becomes nonlinear as the instantaneous frequency of the FM signal departs from the center frequency. The nonlinearity, and hence the distortion, can be mathematically eliminated by removing the "$(1+a^2)^{-1}$" term leaving Equation (6) as a linear function of, and thus, proportional to the normalized frequency deviation, "a", as illustrated in waveform 38. The linear bandwidth of waveform 38 extended well beyond that of waveform 36 which is true for most if not all known FM demodulators and is bounded by $f_{min}$ and $f_{max}$ principally due to the physical limitations of multiplier 16 and current supply 30.

The discussion now turns to the operation of gain controllable multiplier 22 as a means to eliminate the undesirable distortion term. Current $I_{22}$ flowing in the output of multiplier 22 is proportional to the square of the amplitude function of the phase shifted FM signal. The proportionality, or gain, is controlled by current $I_{32}$. The DC transfer function of multiplier 22 is equal to $I_{22}'/I_{32}$ where current $I_{22}'$ is the DC component of current $I_{22}$. The DC transfer function is integrated over each half cycle of the FM signal as:

$$I_{22}'/I_{32} = \omega/\pi \int_0^{\pi/\omega} [v/2 \, V_t *A(\omega)*\sin(\omega t)]^2 \, dt \quad (7)$$

$$= \omega/\pi * [v/2 \, V_t *A(\omega)]^2 \int_0^{\pi/\omega} \tfrac{1}{2}(1 - \cos(2\omega t)) \, dt$$

$$= \omega/\pi * [v/2V_t *A(\omega)]^2 *\pi/2\omega$$

Recall that the amplitude function of the phase shifted FM signal in terms of the normalized frequency deviation is equal to $(1+a^2)^{-\frac{1}{2}}$. The amplitude function is squared by multiplier 22, thus providing the same "$(1+a^2)^{-1}$" term in Equation (8) as in Equation (6).

$$I_{22}'/I_{32}=(v/2V_t)^2/2*(1+a^2)^{-1} \quad (8)$$

Having established the proper foundation for the present invention, the discussion now continues by reconnecting the control inputs of current supplies 30 and 32. As will be shown, gain control circuit 20 provides a means to eliminate the nonlinear $(1+a^2)^{-1}$ term in Equations (6) and (8). Typically, current supply 24 sources current $I_{24}$ into node 27 which is thus compared to $I_{22}'$ thereby generating an error signal proportional to the difference therebetween that is utilized to control current supplies 30 and 32. Capacitor 26 is coupled to node 27 to remove the high frequency components of the error signal. In addition, limiter circuit 28 limits the magnitude of the error signal when the frequency deviations in the FM signal exceed the operating range of FM detector circuit 10. Current supply 32 provides current $I_{32}$ proportional to the error signal for adjusting the overall gain of multiplier 16 to force current $I_{22}'$ to be equal to constant current $I_{24}$. Current supply 32 is a high gain device, thus the finite error signal required to maintain current $I_{32}$ may be neglected such that currents $I_{24}$ and $I_{22}'$ may be considered equal. Continuing from Equation (8), current $I_{24}$ is substituted for current $I_{22}'$ yielding:

$$I_{32} = I_{24} /[(v/2V_t)^2/2* (1 + a^2)^{-1}] \quad (9)$$

$$= [I_{24} *(1 + a^2)]/[(v/2V_t)^2/2]$$

Thus, current $I_{32}$ is proportional to the harmonic distortion of the output signal of FM detector circuit 10. The control input of current supply 30 also receives the error signal for providing current $I_{30}$ which is substantially equal to current $I_{32}$. Substituting current $I_{30}$ for current $I_{32}$ in Equation (9) gives:

$$I_{30}=[I_{24}*(1+a^2)]/[(v/2V_t)^2/2] \quad (10)$$

Recalling Equation (6) and substituting the expression for current $I_{30}$:

$$I_{16}'/I_{30} = -v/\pi V_t *a (1 + a^2)^{-1}$$

$$I_{16}' = [-v/\pi \, V_t *a (1 + a^2)^{-1}] *[I_{24} *(1 + a^2)/ (v/2V_t)^2 /2]$$

Canceling terms, current $I_{16}'$ is now a linear function of the relative frequency deviation, "a".

$$I_{16}'= -I_{24}*(8V_t/v\pi)*a \quad (11)$$

Thus, gain control circuit 20 has cancelled the "$(1+a^2)^{-1}$" term in Equation (6) with a like term in Equation (8), and thereby substantially eliminating the harmonic distortion in current $I_{16}'$. The magnitude of current $I_{16}'$ is now proportional to the deviation of the instantaneous frequency of the FM signal from the center frequency. Also, notice that the current $I_{24}$ of Equation (11) functions as a gain control parameter for current $I_{16}'$. Current supply 24 could be controlled to adjust the slope of the S-curve of waveform 38 in FIG. 3, and thus, the sensitivity of FM detector circuit 10.

Figure 4:
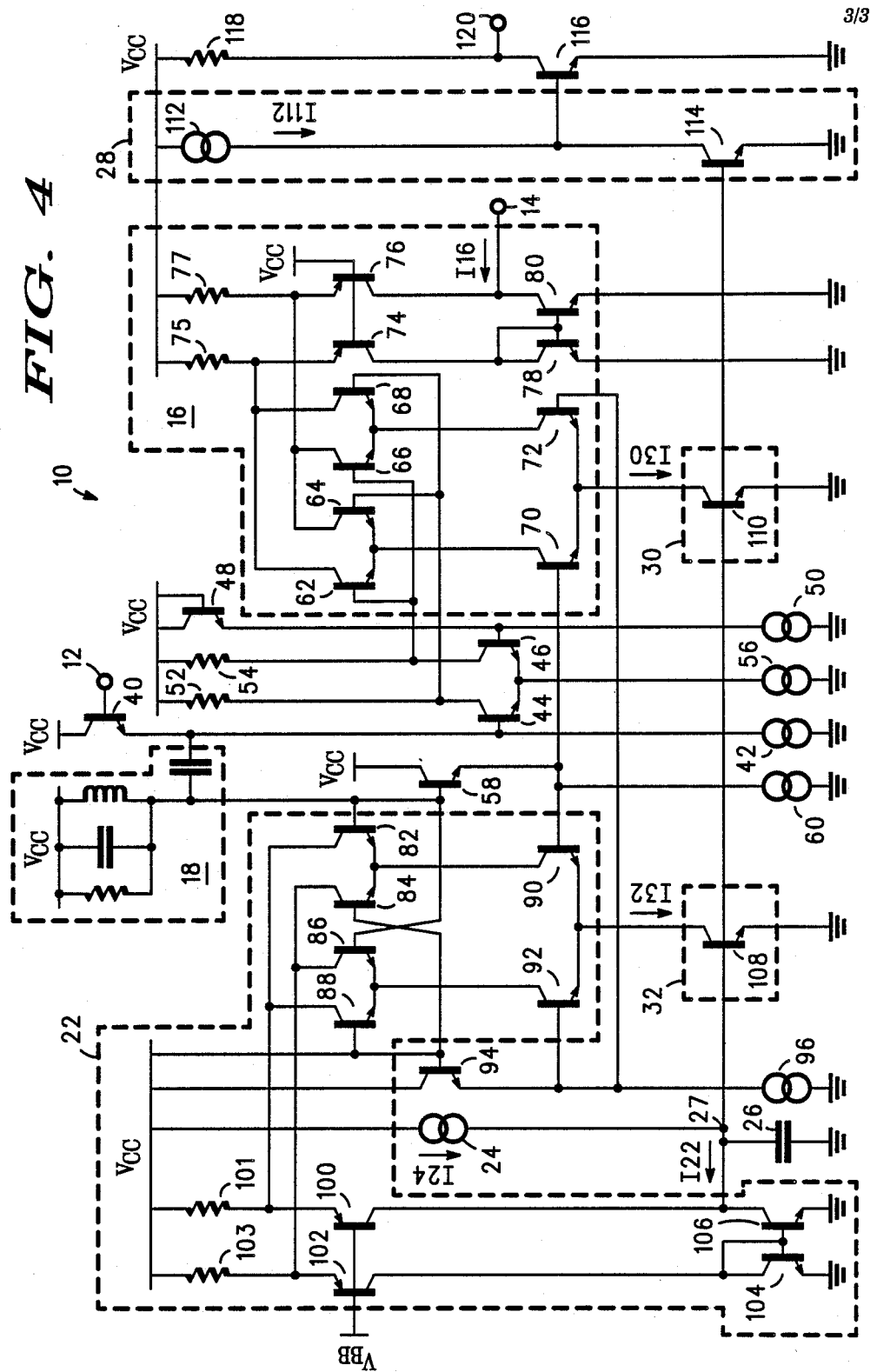
FIG. 4 is a more detailed schematic diagram illustrating the preferred embodiment of FIG. 1.

A detailed schematic diagram of the present invention is illustrated in FIG. 4. The FM signal is applied to input 12 to the base of transistor 40. Transistor 40 operates as an emitter-follower having its emitter coupled to current source 42 wherein the FM input signal is level shifted down one $V_{be}$ (base-emitter voltage) at the base of transistor 44. Differential transistors 44 and 46 convert the singled-ended FM signal to a differential FM signal at the collectors of transistors 44 and 46. Transistor 48 and current supply 50 provide a signal one $V_{be}$ below the supply voltage at the base of transistor 46 for maintaining a reference level for the differential FM signal. Resistors 52 and 54 and current supply 56 may be selected so as to provide the desired average DC voltage for the differential FM signal. Conventional phase shift circuit 18 has an input coupled to the emitter of transistor 40 and an output coupled to the base of transistor 58 for providing the phase shifted FM signal. Emitter-follower transistor 58 and current supply 60 reduce the magnitude of the DC component of the phase shifted FM signal by one $V_{be}$ at the emitter of the former.

Generally known multiplier 16 comprises emitter-coupled transistor pairs 62–64, and 66–68. The collectors of transistors 70 and 72 of multiplier 16 are coupled to the emitters of transistor pairs 62–64 and 66–68 respectively. The emitter of transistor 58 is coupled to the base of transistor 70. The bases of transistors 62 and 66 are coupled together to the collector of transistor 46, and likewise, the bases of transistors 64 and 68 are coupled together to the collector of transistor 44. The collectors of transistors 62 and 68 are coupled together to the emitter of transistor 74, and the collectors of transistors 64 and 66 are coupled together to the emitter of transistor 76. Transistors 74 and 76 in combination with resistors 75 and 77 reduce the magnitude of the differential product signal provided at the collectors of transistors 62 and 64. A conventional differential to single ended converter is realized with transistors 78 and 80 for providing current $I_{16}$ flowing in output 14.

Multiplier 22 comprises emitter-coupled transistor pairs 82–84 and 86–88. The collectors of transistors 90 and 92 of multiplier 22 are coupled to the emitters of transistor pairs 82–84 and 86–88 respectively. The phase shifted FM signal at the base of transistor 58 is also applied to the bases of transistors 82 and 86. A voltage, typically $V_{CC}$, is applied to the bases of transistors 84 and 88. The emitter of transistor 58 is also coupled to the base of transistor 90. Transistor 94 is coupled to current supply 96 for providing a signal one $V_{be}$ below $V_{CC}$ at its emitter and the emitter of transistor 94 is coupled to the bases of transistors 92 and 72. The collectors of transistors 82 and 88 are coupled together to the emitter of transistor 100, and likewise, the collectors of transistors 84 and 86 are coupled together to the emitter of transistor 102. Transistors 100 and 102 in combination with resistors 101 and 103 reduce the magnitude of the differential product signal provided at the collectors of transistors 82 and 86. A conventional differential to single ended converter is realized with transistors 104 and 106 for providing current $I_{22}$ flowing in the output of multiplier 22.

Current supply 24 and capacitor 26 are coupled to the output of multiplier 22 at node 27. The bases of transistors 108 and 110 are also coupled to node 27 and are responsive to the error signal generated at node 27 that is developed across capacitor 26 for providing currents $I_{32}$ and $I_{30}$ flowing in the respective collector-emitter conduction paths thereof the magnitudes of which are varied in response to the error signal. The collector of transistor 108 is coupled to the emitters of transistors 90 and 92 while the collector of transistor 110 is coupled to the emitters of transistors 70 and 72. Limiter circuit 28 comprises current supply 112 and transistor 114 having a base coupled to node 27. The collector current and associated $V_{be}$ of transistor 114 is limited by magnitude of current $I_{112}$. The $V_{be}$'s of transistors 108 and 110 are limited to the same $V_{be}$ as transistor 114, thus currents $I_{30}$ and $I_{32}$ are limited to the magnitude of current $I_{112}$.

The schematic diagram of FIG. 4 also includes a new feature of FM detector circuit 10 comprising transistor 116 and resistor 118 for providing an "in-tune" signal for acknowledging that the FM signal is within the detector operating range. The base of transistor 116 is coupled to the collector of transistor 114. As long as the voltage on the base of transistor 114 is less than the upper limit imposed by current $I_{112}$, then transistor 116 is turned on and the voltage at output 120 is equal to the saturation potential of transistor 116. If the error signal at the base of transistor 114 exceed this upper limit, transistor 114 is saturated which turns off transistor 116 and the voltage at output 120 is then equal to the supply voltage.

What has been provided therefore is a novel FM demodulator circuit providing a means to control the gain of the demodulating multiplier to compensate for the harmonic distortion such that the output signal is proportional to the deviation of the frequency of the FM signal from the center frequency. While there have been described above the principles of the invention in conjunction with a specific apparatus, it is clearly understood that this description is made only by way of example and is not a limitation to the scope of the invention.

I claim:

1. In an FM detection circuit comprising a first multiplier circuit which is responsive to an applied FM signal and a phase shifted FM signal and having a gain control input for providing a demodulated output signal containing undesirable harmonic distortion, the improvement comprising:

current supply means for providing a current at an output;

a second multiplier circuit receiving the phase shifted FM signal and having a gain control input for providing an output signal at an output which is proportional to the square of the phase shifted FM signal;

coupling means coupling said outputs of said current supply means and said second multiplier circuit such that an error signal is produced the magnitude of which is proportional to the harmonic distortion in the output signal of the FM detector circuit; and circuit means responsive to said error signal for providing first and second gain control signals which are proportional to said error signal wherein said first gain control signal controls the magnitude of said output signal of said second multiplier circuit and said second gain control signal controls the magnitude of the output signal of the FM detection circuit so as to substantially eliminate the harmonic distortion thereof.

2. The FM detection circuit of claim 1 wherein said circuit means includes a first transistor having a base coupled to said output of said coupling means and a collector-emitter conduction path coupled between said gain control input of said second multiplier circuit and a power supply terminal wherein said first gain control signal flows through said collector-emitter conduction path to control the gain of said second multiplier such that the magnitude of the DC component of said output signal provided threat remains substantially equal to said current flowing in said current supply means.

3. The FM detection circuit of claim 2 wherein said circuit means further includes a second transistor having a base coupled to said output of said coupling means and a collector-emitter conduction path coupled between said gain control input of said first multiplier circuit and a power supply terminal wherein said second gain control signal flows through said collector-emitter conduction path.

4. The FM detection circuit of claim 3 wherein said coupling means includes a circuit node coupled between said output of said second multiplier circuit and said current supply means for providing said error signal.

5. The FM detection circuit of claim 4 wherein said coupling means further includes a limiter circuit which is coupled to said circuit node for limiting the magnitude of said error signal.

6. The FM detection circuit of claim 5 wherein said limiter circuit includes:
   current supply means for providing a current having a predetermined magnitude;
   a third transistor having a base coupled to said circuit node and a collector-emitter conduction path coupled between said current supply means and a power supply terminal.

7. The FM detection circuit of claim 6 wherein said coupling means further includes capacitor means having a first terminal coupled to said circuit node and a second terminal at which a voltage is applied.

8. In an integrated FM detection circuit comprising a first multiplier circuit which is responsive to an applied FM signal and a phase shifted FM signal and having a gain control input for providing a demodulated output signal containing undesirable harmonic distortion, the improvement comprising:
   current supply means for providing a current at an output;
   a second multiplier circuit receiving the phase shifted FM signal and having a gain control input for providing an output signal at an output which is proportional to the square of the phase shifted FM signal;
   coupling means coupling said outputs of said current supply means and said second multiplier circuit such that an error signal is produced the magnitude of which is proportional to the harmonic distortion in the output signal of the FM detector circuit; and
   circuit means responsive to said error signal for providing first and second gain control signals which are proportional to said error signal wherein said first gain control signal controls the magnitude of said output signal of said second multiplier circuit and said second gain control signal controls the magnitude of the output signal of the FM detection circuit so as to substantially eliminate the harmonic distortion thereof.

9. The FM detection circuit of claim 8 wherein said circuit means includes a first transistor having a base coupled to said output of said coupling means and a collector-emitter conduction path coupled between said gain control input of said second multiplier circuit and a power supply terminal wherein said first gain control signal flows through said collector-emitter conduction path to control the gain of said second multiplier such that the magnitude of the DC component of said output signal provided thereat remains substantially equal to said current flowing in said current supply means.

10. The FM detection circuit of claim 9 wherein said circuit means further includes a second transistor having a base coupled to said output of said coupling means and a collector-emitter conduction path coupled between said gain control input of said first multiplier circuit and a power supply terminal wherein said second gain control signal flows through said collector-emitter conduction path.

11. The FM detection circuit of claim 10 wherein said coupling means includes a circuit node coupled between said output of said second multiplier circuit and said current supply means for providing said error signal.

12. The FM detection circuit of claim 11 wherein said coupling means further includes a limiter circuit which is coupled to said circuit node for limiting the magnitude of said error signal.

13. The FM detection circuit of claim 12 wherein said limiter circuit includes:
   current supply means for providing a current having a predetermined magnitude;
   a third transistor having a base coupled to said circuit node and a collector-emitter conduction path coupled between said current supply means and a power supply terminal.

14. The FM detection circuit of claim 13 wherein said coupling means further includes capacitor means having a first terminal coupled to said circuit node and a second terminal at which a voltage is applied.

* * * * *

UNITED STATES PATENT AND TRADEMARK OFFICE
CERTIFICATE OF CORRECTION

PATENT NO. : 4,926,132  
DATED : May 15, 1990  
INVENTOR(S) : William E. Main

Page 1 of 2

It is certified that error appears in the above-identified patent and that said Letters Patent is hereby corrected as shown below:

Column 4, line 41, delete the equation $$" I_{16}'/I_{30} = w/p \int_0^{p/w} v/2V_t * A(w)*\sin(wt + f(w) + p/2)\, dt \quad (3) "$$

and insert the following equation therefor $$-- I_{16}'/I_{30} = w/p \int_0^{p/w} v/2V_t * A(w)*\sin(wt + f(w) + p/2)\, dt \quad (3) --.$$

Column 5, line 36, delete the equation $$" I_{22}'/I_{32} = w/p \int_0^{p/w} [v/2V_t * A(w) * \sin(wt)]^2\, dt \quad (7) "$$

and insert the following equation therefor $$-- I_{22}'/I_{32} = w/p \int_0^{p/w} [v/2V_t * A(w) * \sin(wt)]^2\, dt \quad (7) --.$$

Column 5, line 39 delete the equation $$" = w/p * [v/2V_t * A(w)]^2 \int_0^{p/w} 1/2\,(1 - \cos(2wt))\, dt "$$

and insert the following equation therefor $$-- = w/p * [v/2V_t * A(w)]^2 \int_0^{p/w} 1/2\,(1 - \cos(2wt))\, dt --.$$

UNITED STATES PATENT AND TRADEMARK OFFICE
CERTIFICATE OF CORRECTION

PATENT NO. : 4,926,132

DATED : May 15, 1990

INVENTOR(S) : William E. Main

It is certified that error appears in the above-identified patent and that said Letters Patent is hereby corrected as shown below:

In column 8, line 50, claim 2, delete "threat" and insert therefor --thereat--.

Signed and Sealed this

Eleventh Day of February, 1992

Attest:

HARRY F. MANBECK, JR.

*Attesting Officer*　　*Commissioner of Patents and Trademarks*